United States Patent
Nagano et al.

(10) Patent No.: US 9,825,083 B2
(45) Date of Patent: Nov. 21, 2017

(54) OPTICAL DETECTOR WITH PHOTODIODE ARRAY HAVING AVALANCHE PHOTODIODES CONNECTED TO QUENCHING RESISTORS

(71) Applicant: HAMAMATSU PHOTONICS K.K., Hamamatsu-shi, Shizuoka (JP)

(72) Inventors: Terumasa Nagano, Hamamatsu (JP); Kenichi Sato, Hamamatsu (JP); Ryutaro Tsuchiya, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 15/104,359

(22) PCT Filed: Dec. 16, 2014

(86) PCT No.: PCT/JP2014/083269
§ 371 (c)(1),
(2) Date: Jun. 14, 2016

(87) PCT Pub. No.: WO2015/093482
PCT Pub. Date: Jun. 25, 2015

(65) Prior Publication Data
US 2016/0322417 A1    Nov. 3, 2016

(30) Foreign Application Priority Data
Dec. 19, 2013 (JP) .................. 2013-262598

(51) Int. Cl.
*H01L 27/146* (2006.01)
*H01L 27/144* (2006.01)
(Continued)

(52) U.S. Cl.
CPC .... *H01L 27/14663* (2013.01); *H01L 27/1446* (2013.01); *H01L 27/14603* (2013.01);
(Continued)

(58) Field of Classification Search
CPC ......... H01L 27/14663; H01L 27/14603; H01L 27/1446; H01L 31/115; H01L 27/14636;
(Continued)

(56) References Cited

U.S. PATENT DOCUMENTS

2009/0008566 A1*  1/2009  Agarwal .......... H01L 27/14658
                                                        250/370.11
2013/0009266 A1    1/2013  Sato et al.
(Continued)

FOREIGN PATENT DOCUMENTS

CN    103190000     7/2013
EP    2 040 308     3/2009
(Continued)

OTHER PUBLICATIONS

International Preliminary Report on Patentability dated Jun. 30, 2016 for PCT/JP2014/083269.
(Continued)

*Primary Examiner* — Michael Jung
(74) *Attorney, Agent, or Firm* — Drinker Biddle & Reath LLP

(57) ABSTRACT

Disclosed is an optical detector in which a boundary line BY defining an edge of a semiconductor region 14 is covered with signal read wiring E3 and a capacitor is configured between the semiconductor region 14 and the signal read wiring E3. High frequency components peak components of a carrier are quickly extracted to the outside via the capacitor, but the signal read wiring E3 covers the boundary line BY so that a semiconductor potential in the vicinity of the boundary line is stabilized and an output signal is stabilized.

5 Claims, 12 Drawing Sheets

(51) Int. Cl.
*H01L 31/107* (2006.01)
*H01L 31/115* (2006.01)

(52) U.S. Cl.
CPC .. *H01L 27/14636* (2013.01); *H01L 27/14658* (2013.01); *H01L 27/14676* (2013.01); *H01L 31/1075* (2013.01); *H01L 31/115* (2013.01)

(58) Field of Classification Search
CPC ......... H01L 27/14643; H01L 27/14658; H01L 27/14676
See application file for complete search history.

(56) References Cited

U.S. PATENT DOCUMENTS

| | | |
|---|---|---|
| 2013/0056843 A1 | 3/2013 | Lee et al. |
| 2013/0099100 A1* | 4/2013 | Pavlov ................. H01L 31/107 250/208.2 |
| 2013/0193546 A1* | 8/2013 | Webster ............. H01L 27/1443 257/438 |
| 2013/0270666 A1* | 10/2013 | Sato .................... H01L 27/1446 257/438 |
| 2014/0263975 A1* | 9/2014 | Nagano ................ H01L 27/144 250/208.2 |
| 2015/0108358 A1* | 4/2015 | Sasaki ............... H01L 31/02327 250/370.11 |

FOREIGN PATENT DOCUMENTS

| | | |
|---|---|---|
| JP | 2008-311651 A | 12/2008 |
| JP | 2013-088319 A | 5/2013 |
| JP | 2013-195295 A | 9/2013 |
| TW | 201232800 A | 8/2012 |
| WO | WO-2012/057082 A1 | 5/2012 |

OTHER PUBLICATIONS

Nagano, T. et al., "Improvement of Multi-Pixel Photon Counter (MPPC)", Nuclear Science Symposium and Medical Imaging Conference (NSS/MIC), DOI:10.1109/NSSMIC.2011.6154655, ISBN:978-1-4673-0118-3, Oct. 23, 2011, p. 1657-p. 1659, XP032121917.

* cited by examiner

Fig.4
(A)
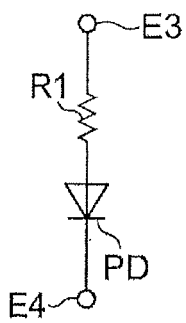
(B)
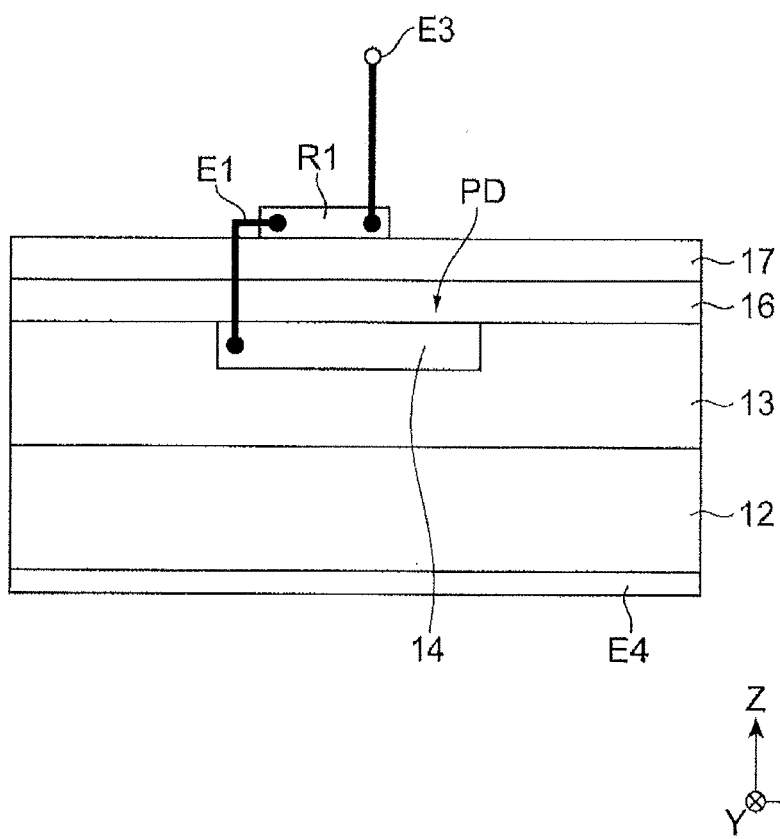

*Fig.12*
(A)
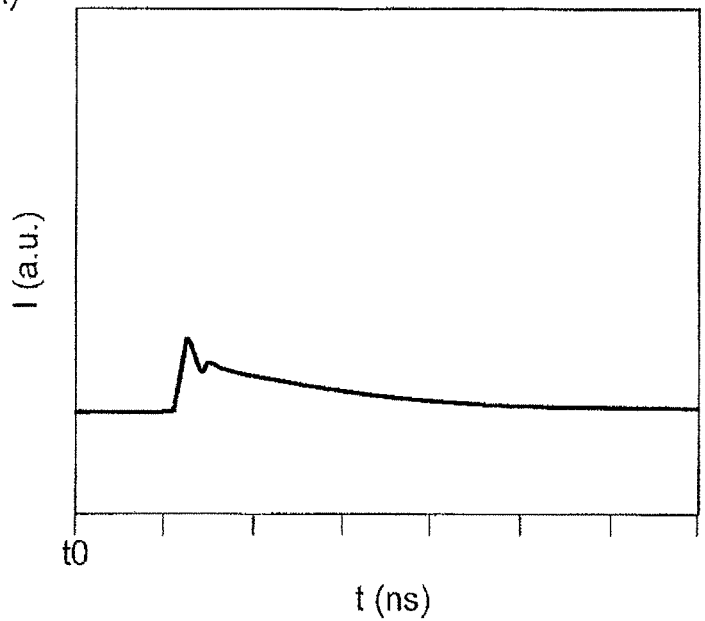
(B)
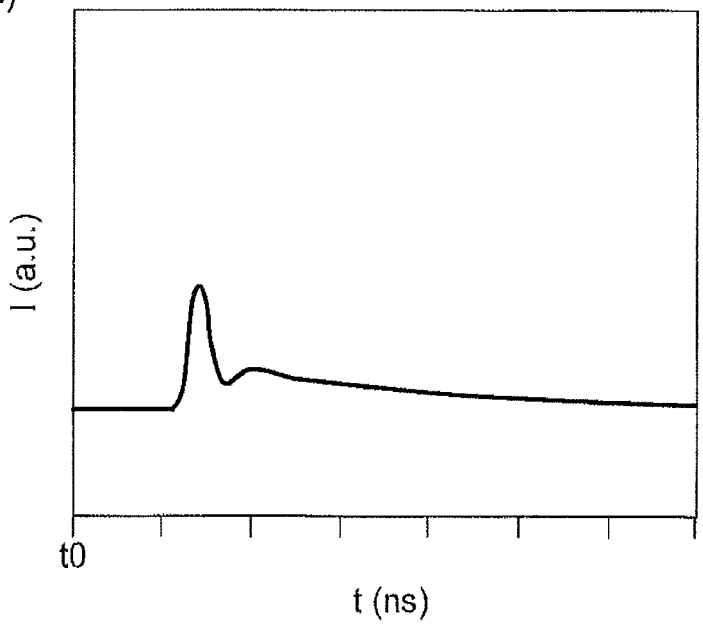

OPTICAL DETECTOR WITH PHOTODIODE ARRAY HAVING AVALANCHE PHOTODIODES CONNECTED TO QUENCHING RESISTORS

TECHNICAL FIELD

The present invention relates to an optical detector available in medical devices such as a positron CT device (a positron emission tomography: PET device) and a CT device.

BACKGROUND ART

At present, various medical devices are used. A PET device introduces a drug labeled with an isotope adapted to emit positrons into an organism and detects γ-rays derived from the drug with a plurality of detectors. The PET device includes a ring-shaped gantry (a frame), a cradle (a bed), and a computer for operation and the plurality of detectors arranged about the organism are embedded in the gantry.

An efficient detector for X-rays or γ-rays can be configured by combining a scintillator and an optical detector.

A CT/PET device obtained by combining an X-ray CT device and a PET device and a composite diagnostic device obtained by combining a magnetic resonance imaging (MRI) device with them have also been considered.

Optical detectors (photodiode arrays) employed in diagnostic devices such as those mentioned above are described in, for example, Patent Literature 1. A photodiode array such as a silicon photo multiplier (SiPM) or a pixelated photon detector (PPD) has a configuration in which avalanche photodiodes (APDs) are arranged in a matrix, a plurality of APDs are connected in parallel, and the sum of APD outputs is read. When operated in a Geiger mode, the APD can detect weak light.

That is, when photons are incident on the APD, a carrier generated within the APD is externally output through a quenching resistor and a signal read wiring pattern. A current flows through a pixel in which an electron avalanche is generated in the APD, but a voltage drop occurs in quenching resistors of about several hundred kΩ connected in series to the pixel. This voltage drop lowers the voltage applied to an amplification region of the APD, thereby terminating a multiplication action caused by the electron avalanche. Thus, the APD outputs one pulse signal when one photon is incident thereon.

In devices such as PET devices, a peak (an incident timing of a photon) of an output signal from an optical detector and a detected photon amount (sensitivity) are used and it is preferable for both the peak and the photo amount to have large values.

CITATION LIST

Patent Literature

[Patent Literature 1] Japanese Unexamined Patent Publication No. 2008-311651

SUMMARY OF INVENTION

Technical Problem

In a conventional optical detector, improving an aperture ratio and sensitivity of a photodiode array by reducing a region between light detection channels adjacent to each other is limited because a circumference of each light detection channel constituting the photodiode array is covered with a metal film such as Al for potential stabilization and a quenching resistor is arranged outside the metal film with which the circumference of the light detection channel is covered. Also, it is necessary to reduce an influence of fluctuation of a baseline of an output signal due to noise or the like and improve temporal resolution by increasing a peak of the output signal.

The present invention has been made in view of the above-described problem and an objective of the invention is to provide an optical detector for improving temporal resolution by increasing a peak of an output signal and implementing a high aperture ratio and high sensitivity.

Solution to Problem

To solve the above-described problem, an optical detector according to an aspect of a first invention is an optical detector comprising: a semiconductor substrate; a first semiconductor region formed on the semiconductor substrate; a plurality of second semiconductor regions formed two-dimensionally within the first semiconductor region and having a higher impurity concentration than the first semiconductor region; a plurality of quenching resistors electrically connected to the second semiconductor regions, respectively; and a signal read wiring electrically connected to the plurality of quenching resistors, wherein the optical detector comprises a pn junction that forms an APD operable in a Geiger mode formed in an interface between the semiconductor substrate and the first semiconductor region or an interface between the first semiconductor region and the second semiconductor region, wherein the quenching resistor is positioned above the second semiconductor region, and wherein, in a plan view, the signal read wiring surrounds a circumference of each second semiconductor region in a ring shape and covers a boundary line between the second semiconductor region and the first semiconductor region.

According to this optical detector, because the signal read wiring surrounds the circumference of the second semiconductor region in the ring shape to cover the boundary line, a distance between the second semiconductor region and the signal read wiring is significantly short and a capacitor is configured between the second semiconductor region and the signal read wiring. High frequency components (peak components) of a carrier generated in the second semiconductor region in response to an incidence of a photon are quickly extracted to the outside via the capacitor. Also, the signal read wiring covers the above-described boundary line so that a potential in the vicinity of the boundary line in the semiconductor is stabilized and the output signal is stabilized. Here, the signal read wiring can be formed in the above-described arrangement because the quenching resistor is formed on the second semiconductor region and it is possible to increase a photon amount (sensitivity) to be detected per pixel because it is unnecessary to reduce an aperture ratio of the second semiconductor region due to an impediment by the wiring or the quenching resistor.

As described above, according to the optical detector, it is possible to increase a peak of the output signal, implement a high aperture ratio and high sensitivity, and further stabilize the output signal.

Also, in the optical detector according to an aspect of a second invention, in the plan view, the signal read wiring covers the entire boundary line between the second semiconductor region and the first semiconductor region.

In this case, it is possible to increase the peak of the output signal via the signal read wiring by increasing the capacitance of the capacitor formed between the signal read wiring and the second semiconductor region.

Also, in the optical detector according to an aspect of a third invention, in the plan view, the signal read wiring covers a part of the boundary line between the second semiconductor region and the first semiconductor region, and a size of a width direction of the signal read wiring of the covering part in the signal read wiring is greater than a size of a width direction of a part adjacent to the part.

In this case, the signal read wiring covers only the part of the above-described boundary line, but it is possible to increase the peak of the output signal via the signal read wiring by increasing the capacitance of the capacitor because the size of the width direction is large.

Also, an optical detector according to an aspect of a fourth invention is an optical detector comprising: a semiconductor substrate; a first semiconductor region formed on the semiconductor substrate; a plurality of second semiconductor regions formed two-dimensionally within the first semiconductor region and having a higher impurity concentration than the first semiconductor region; a plurality of quenching resistors electrically connected to the second semiconductor regions, respectively; and a signal read wiring electrically connected to the plurality of quenching resistors, and wherein the optical detector comprises a pn junction that forms an APD operable in a Geiger mode formed in an interface between the semiconductor substrate and the first semiconductor region or an interface between the first semiconductor region and the second semiconductor region, wherein each of the quenching resistors is positioned above each of the second semiconductor regions, wherein, in a plan view, the signal read wiring surrounds a circumference of each second semiconductor region in a ring shape, and wherein each quenching resistor linearly extends without being bent.

According to this optical detector, because the signal read wiring surrounds the circumference of the second semiconductor region in the ring shape, a distance between the second semiconductor region and the signal read wiring is significantly short and a capacitor is configured between the second semiconductor region and the signal read wiring. High frequency components (peak components) of a carrier generated in the second semiconductor region in response to an incidence of a photon are quickly extracted to the outside via the capacitor. Here, the signal read wiring can be formed in the above-described arrangement because the quenching resistor is formed on the second semiconductor region and it is possible to increase a photon amount (sensitivity) to be detected per pixel because it is unnecessary to reduce an aperture ratio of the second semiconductor region due to an impediment by the wiring or the quenching resistor. Also, the quenching resistor linearly extends without being bent so that there is an advantage in that a part which covers the second semiconductor region decreases and the aperture ratio increases.

Advantageous Effects of Invention

According to an optical detector of the present invention, it is possible to increase a peak of an output signal, implement a high aperture ratio and high sensitivity.

BRIEF DESCRIPTION OF DRAWINGS

FIG. 4 is a circuit diagram (A) of one photodiode and a quenching resistor and a diagram (B) illustrating a unit structure within a semiconductor chip for implementing their configurations.

FIG. 12 is a graph illustrating time (ns) and intensity (a.u.) of an output signal of a photodiode array, wherein (A) illustrates data of a comparative example and (B) illustrates data of an embodiment.

DESCRIPTION OF EMBODIMENTS

Hereinafter, an optical detector according to an embodiment will be described. Also, the same elements or elements having the same functions are assigned the same reference signs and redundant description thereof will be omitted.

First, a subject diagnostic device to which the optical detector according to the embodiment can be applied will be described.

Figure 1:
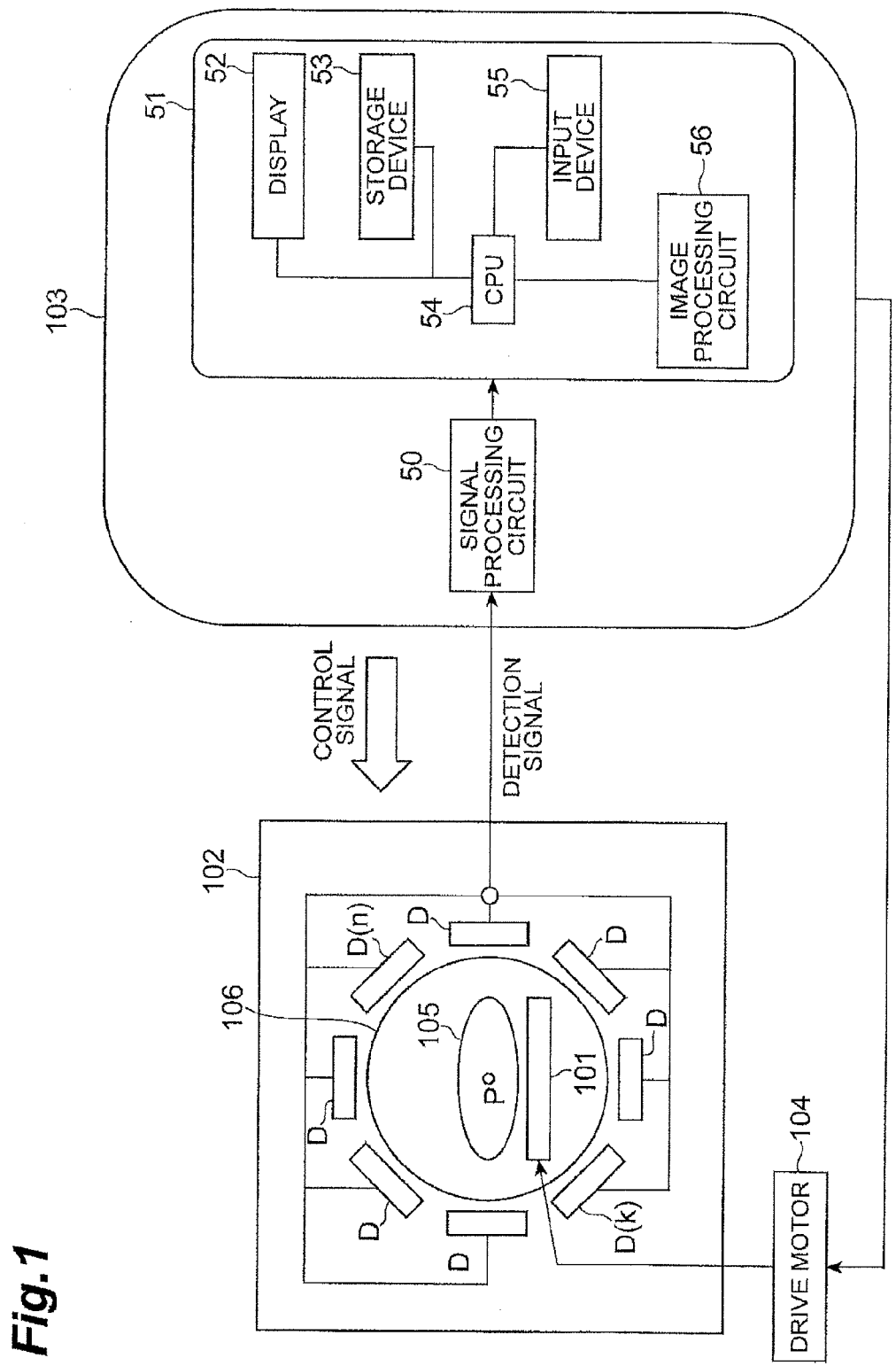
FIG. 1 is a diagram illustrating a configuration of a subject diagnostic device such as a PET device.

FIG. 1 is a schematic view of a subject diagnostic device such as a PET device or a CT device. This subject diagnostic device is general and the optical detector according to the embodiment can be applied to such a subject diagnostic device.

The subject diagnostic device includes a cradle 101, a gantry 102 having an opening for internally positioning the cradle 101, and a control device 103. The control device 103 controls a drive motor 104 for moving the cradle 101 with a drive motor control signal to change a relative position of the cradle 101 with respect to the gantry 102. A subject 105 to be diagnosed is arranged on the cradle 101. The subject 105 is transported into the opening of the gantry 102 according to driving of the drive motor 104. The drive motor 104 may move either the cradle 101 or the gantry 102.

A plurality of detection devices 106 are arranged to surround the opening of the gantry 102. Each of the detection devices 106 has a plurality of detectors D (see FIG. 2).

Figure 2:
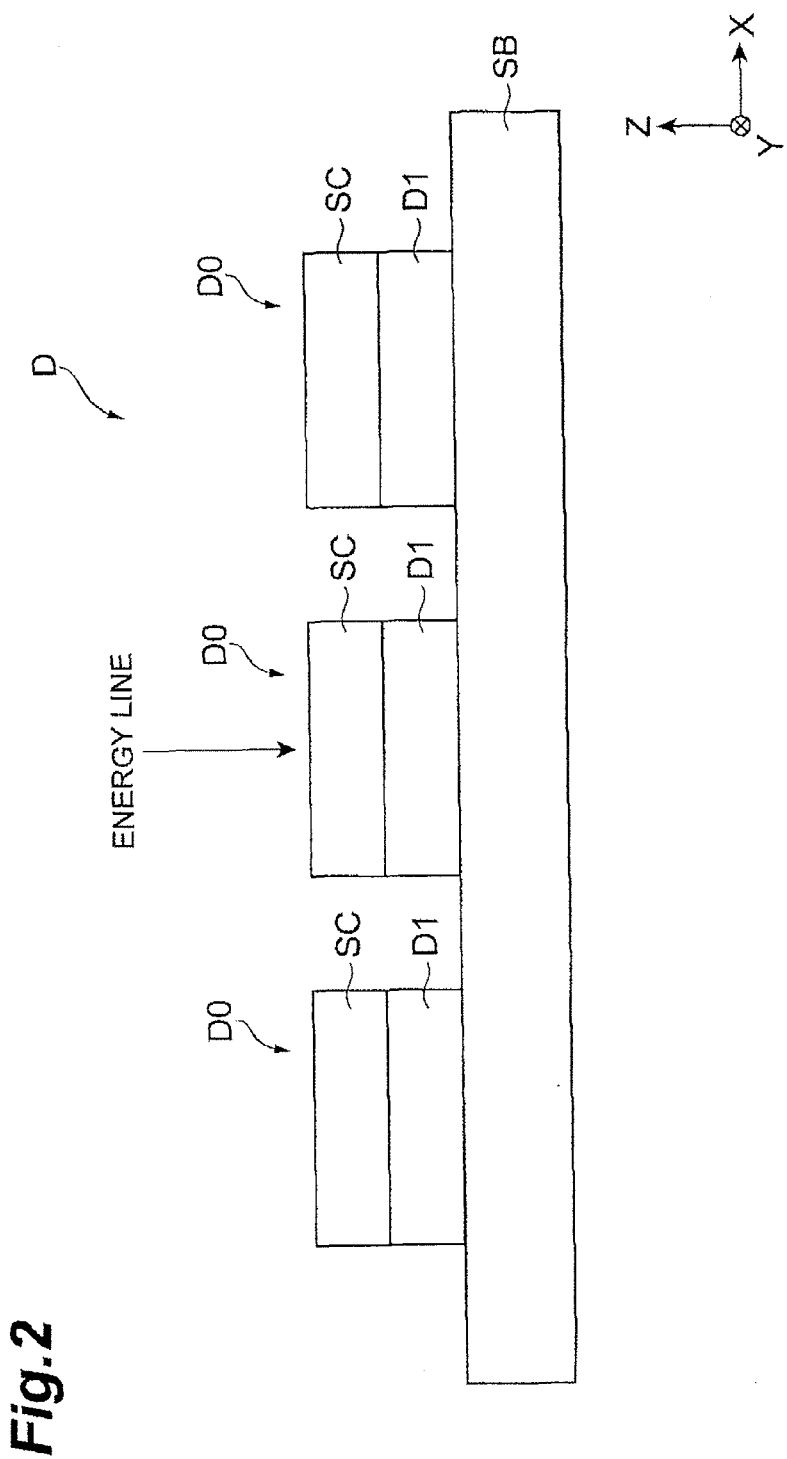
FIG. 2 is a diagram illustrating a structure of a detector D including a scintillator SC and an optical detector D1.

FIG. 2 is a diagram illustrating a structure of the detector D. A plurality of detection chips D0 are arranged on a substrate SB. One detection chip D0 includes an optical detector D1 and a scintillator SC fixed on the optical detector D1. When energy lines (radioactive rays) such as X-rays or γ-rays are incident on the scintillator SC, fluorescence is generated and detected by the optical detector D1.

Referring again to FIG. 1, a control signal for controlling the detection device 106 is output from the control device 103 to the gantry 102 and a detection signal from the detection device 106 is input from the gantry 102 to the control device 103.

First, a case in which the subject diagnostic device is the PET device will be described.

In the PET device, the plurality of detectors D are arranged in a ring shape to surround the opening of the gantry. The optical detector D1 included in each detector D has a plurality of photodiode arrays (PDAs) (see FIG. 3) arranged two-dimensionally. A type of radioisotope (RI) (a positron-emitting radionuclide) in which positrons are emitted is injected into the subject 105. The RI used in the PET device is an element existing in an organism such as carbon, oxygen, fluorine, and nitrogen. The positrons are combined with negatrons within a body and therefore annihilation radiation (γ-rays) is generated. That is, the subject 105 emits γ-rays. The detectors D detect the emitted γ-rays, and output detection signals to a signal processing circuit 50 in the control device 103.

Figure 3:
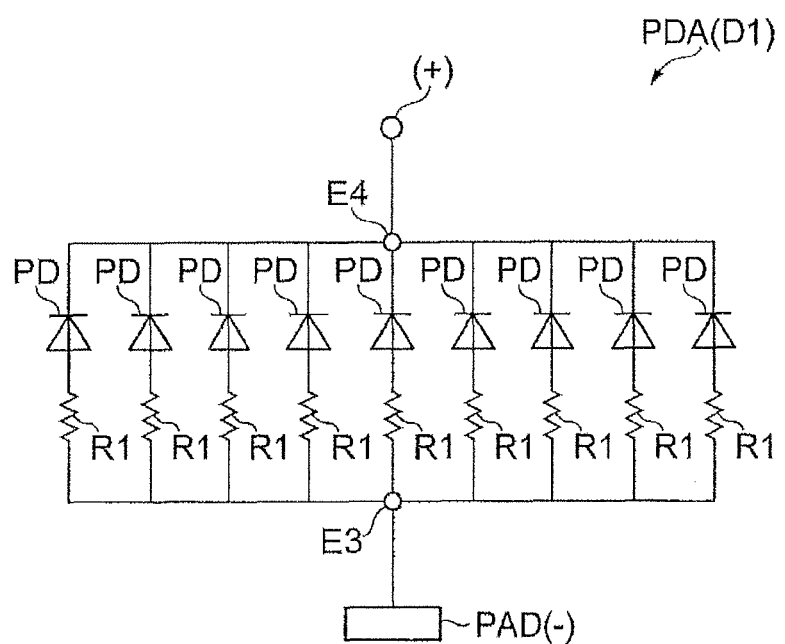
FIG. 3 is a circuit diagram of a photodiode array PDA constituting the optical detector D1.

The detector D is an aggregate of a plurality of photodiode arrays (PDAs) (see FIG. 3). The signal processing circuit 50 processes a detection signal from the detector D and outputs a timing T of a waveform peak of the detection signal output from the optical detector in an initial step when fluorescence emitted from the scintillator is incident on the optical detector according to (1) total energy E output from the detectors D, (2) an incident position P of γ-rays among the plurality of photodiode arrays (PDAs), and (3) incidence of γ-rays.

After an AD conversion circuit (not illustrated) converts the energy E, the position P, and the timing T which are output information into digital signals according to the γ-rays emitted from the subject 105, the digital signals are input to a computer 51. The computer 51 includes a display 52, a storage device 53, a central processing unit (CPU) 54, an input device 55, and an image processing circuit 56 constituted of software. When a processing command is input from the input device 55 to the CPU 54, a control signal is transmitted to each detector D on the basis of a program stored in the storage device 53 and ON/OFF of the detector D can be controlled.

The image processing circuit 56 performs image processing on the detection signals (the energy E, the position P, and the timing T) output from the detectors D and creates an image related to internal information of the subject 105, that is, a tomographic image. Because a plurality of algorithms of image processing are conventionally known, it is only necessary to apply the known algorithms. The created image can be stored within the storage device 53 and displayed on the display 52. A program for performing image processing, etc. is stored in the storage device 53 and the program is operated according to a command from the CPU 54. A series of operations necessary for examinations (outputting control signals (ON/OFF of the detectors) to the detector D, controlling the drive motor, receiving detection signals from the detectors D, image processing, storing the created image in the storage device, and displaying on the display) may be performed by the input device 55.

From an RI position P within the subject 105, γ-rays are emitted in one direction and a direction opposite thereto. While the plurality of detectors D are arranged in the ring shape, the γ-rays are incident on a specific detector D(n) and a detector D(k) opposite thereto across the RI position. When N detectors D are arranged on one ring, the γ-rays are incident on an $n^{th}$ detector D(n) and a $k^{th}$ detector D(k) counted clockwise from the detector D located at the highest position. Assuming that the RI position P is located at the center of the ring, and the γ-rays are directed in directions opposite to each other within a plane of the ring, $k=n+(2/N)$. Here, n, k, and N are natural numbers.

When the PET device is of a time of flight (TOF) type, a substance containing the RI is administered to a human body, an animal, a plant, or the like, and radiation pairs (γ-rays) generated by annihilation of electron/positron pairs are measured from the subject to be measured to obtain information about a distribution of the administered substance within the subject to be measured. That is, when timings T output from signal processing circuits 50 of the detectors D arranged at opposite positions are determined, position detection is possible because a difference between the timings corresponds to a displacement distance of the RI position P from the center of gravity of the ring on a diagonal line between the opposite detectors D.

When two timings T are obtained, the computer 51 determines whether the two timings have been generated due to electron/positron annihilation. This determination is performed according to whether γ-rays are detected in another detector D(k) during a fixed time interval before and after a detection time at which γ-rays are detected in one detector D(n). When detected under this condition, a γ-ray pair generated according to the same electrode/positron pair annihilation can be determined. It can be adopted in image processing in the image processing circuit 56 as a valid value.

When the signal intensity of the detector D exceeds a predetermined threshold value (referred to as SH) in the measurement of the timing T, it is determined that the γ-rays are incident. Otherwise, it is determined that the γ-rays are not incident. For example, the threshold SH is set near 511 keV which is photon energy of a pair of γ-rays occurring when an electron/positron pair is annihilated. This eliminates electric noise signals, noise signals derived from scattering γ-rays (one or both of annihilation γ-rays are γ-rays having their directions changed by scattering substances and their energy is reduced by scattering), etc.

Because the incidence of fluorescence from the scintillator to the optical detector continues even after the determination of the timing T, it is possible to obtain an intensity of the incident fluorescence, that is, the energy E, when an integrated value of a fluorescence incidence amount is obtained. An incidence position P of the fluorescence within each detector D can be calculated by obtaining a two-dimensional center of gravity of the signal intensity from each photodiode array in the signal processing circuit 50. This position P can be used when more precise image analysis is performed as necessary.

The TOF-PET device has a radioactive ray detector array (the detection device 106) including a plurality of detectors D, the signal processing circuit 50, and the computer 51 which performs image processing on the basis of an output of the signal processing circuit 50. Although these components are adopted in all the detectors D arranged in the ring shape, one signal processing circuit 50 is representatively illustrated in FIG. 1 to clarify the description.

Next, a case in which the subject diagnostic device is an X-ray CT device will be described.

While the X-ray CT device includes the cradle 101 and the gantry 102 which have the above-mentioned structures, the gantry 102 incorporates therein an X-ray source (not illustrated) for emitting X-rays. A plurality of detectors D are arranged at positions where the X-rays from the X-ray source are incident, whereby the detection device 106 is configured.

The subject 105 is arranged in the cradle 101 located within the opening of the gantry 102 of FIG. 1 and is irradiated with the X-rays from the X-ray source. The X-rays transmitted through the subject 105 are detected by the plurality of detectors D, their detection signals are input to the computer 51 via the signal processing circuit 50 in which an amplifier, etc. are embedded and subjected to image processing, so that an image related to internal information of the subject 105, that is, a computer tomographic image, can be obtained. In the case of the X-ray CT device, the detector D may be configured to rotate about an opening axis of the gantry 102.

When the PET device and the X-ray CT device are integrated, the control device 103 can superimpose an image obtained by the PET device with an image obtained by the X-ray CT device. Because the detector D according to the embodiment is used in the X-ray CT device, it is possible to acquire a high-quality image.

The subject 105 is arranged at the center of the detection device 106 arranged in the ring shape. The detection device 106 rotates about a rotary axis AX. X-rays are radiated from the X-ray source (not illustrated) to the subject 105 and the X-rays transmitted through the subject 105 are incident on a plurality of detectors D(n). An output of each detector is input to the computer 51 via the signal processing circuit 50. The control device 103 of the X-ray CT device includes a display 52, a CPU 54, a storage device 53, an input device 55, and an image processing circuit 56 having functions similar to those of the PET device.

When a photography start instruction is performed by the input device 55, a program stored in the storage device 53 starts up, an X-ray drive circuit is controlled, a drive signal is output from the X-ray drive circuit to the X-ray source, and X-rays are emitted from the X-ray source. Also, the program stored in the storage device 53 starts up, the gantry drive motor is driven, the detection device 106 rotates about the gantry opening axis and further outputs a control signal (ON/OFF of the detector) to the detector D to turn ON the detector D, and a detection signal is input to the image processing circuit 56 of the computer 51 via the signal processing circuit 50. The image processing circuit 56 creates a computer tomographic image according to a tomographic image creation program input to the storage device 53. The created image can be stored in the storage device 53 and displayed on the display 52.

As described above, the storage device 53 stores programs for performing image processing and the like, and the programs operate according to instructions from the central processing unit (CPU) 54. A series of operations required for an examination (outputting control signals (ON/OFF of the detectors) to the detectors D, controlling various types of drive motors, receiving detected signals from the detectors D, image processing of the detected signals, storing the created image in the storage device, and displaying on the display) can be performed by the input device 55.

As various type of programs, those installed in conventional systems can be used.

FIG. 3 is a circuit diagram of the photodiode array PDA.

The optical detector D1 includes a semiconductor chip and the photodiode array PDA is formed within a photosensitive region of the semiconductor chip. The photodiode array PDA has a plurality of photodiodes PD and quenching resistors R1 connected to the photodiodes PD in series. Cathodes of the photodiodes PD are commonly connected and anodes thereof are commonly connected via the quenching resistors R1. The plurality of photodiodes PD are two-dimensionally arranged.

Also, all of the quenching resistors R1 are connected to an electrode pad PAD via an electrode or wiring E3. In the semiconductor chip, a potential (+) of a cathode side of the photodiode PD is set to be relatively higher than a potential (−) of the anode side. A signal is extracted from the electrode pad PAD serving as the anode. Also, the cathode and the anode can be replaced with each other in the photodiode. Although there are N and P types as conduction types in the semiconductor chip, a similar function can be obtained even when the N and P types are replaced with each other.

Also, the photodiode PD is an avalanche photodiode (APD) which operates in the Geiger mode. In the Geiger mode, a reverse voltage (a reverse bias voltage) higher than a breakdown voltage of the APD is applied between the anode and the cathode of the APD. That is, a potential (−) lower than a reference value is applied to the anode and a potential (+) higher than the reference value is applied to the cathode. Polarities of these potentials are relative and one potential can also be set as a ground potential.

FIG. 4 is a circuit diagram (A) of one photodiode PD and a quenching resistor R1 and a diagram (B) illustrating a unit structure within a semiconductor chip for implementing their configurations. Because the photodiode array is formed within the semiconductor chip, a plurality of unit structures as illustrated in FIG. 4 are two-dimensionally formed.

A semiconductor region 12 constituting the semiconductor substrate is made of Si and is an N type (a first conduction type) semiconductor substrate. The anode of the photodiode PD is a P type (a second conduction type) semiconductor region 13 (14) and the cathode thereof is the N type semiconductor region 12. When photons are incident on the photodiode PD serving as the APD, photoelectric conversion is performed within the substrate and photoelectrons are generated. Avalanche multiplication is performed in a region near a pn junction interface of the semiconductor region 13 and an amplified electron group flows toward an electrode E4 formed on a rear surface of the semiconductor region 12. This electrode E4 may be provided on a front surface side. That is, when photons are incident on the photodiode PD, the photons are multiplied and extracted from the electrode electrically connected to the quenching resistor R1 or the wiring E3 as a signal. The wiring E3 is connected to the above-described electrode pad PAD.

Also, the quenching resistor R1 is formed on an upper insulating layer 17 between two insulating layers 16 and 17 and is electrically connected to the semiconductor region 14 (a light detection channel) having a higher impurity concentration than the semiconductor region 13. The electrode E4 for applying a substrate potential is provided in the rear surface of the semiconductor substrate and the electrode E4 is connected to, for example, a positive potential.

A contact hole is provided in the insulating layers 16 and 17 and the semiconductor region 14 and the quenching resistor R1 are electrically connected via a contact electrode and a wiring E1 within the contact hole. Also, the wirings E1 and E3 are formed above the insulating layer 16.

Figure 5:
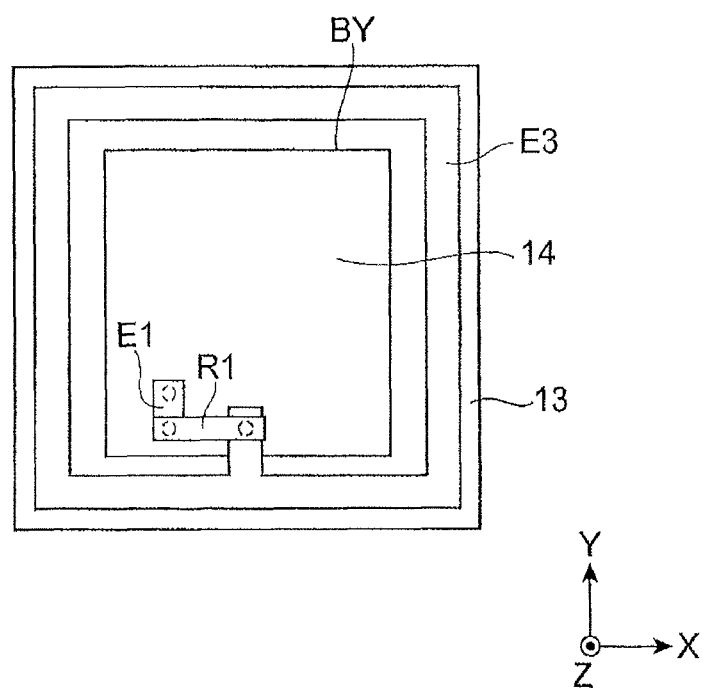
FIG. 5 is a plan view of the unit structure illustrated in FIG. 4.

FIG. 5 is a plan view of the unit structure illustrated in FIG. 4. Also, the illustration of the insulating layers 16 and 17 is omitted in the following plan view to more clearly show an internal structure.

The wiring E1 is connected to the quenching resistor R1 via the contact hole provided in the insulating layers 16 and 17 (see FIG. 17). The quenching resistor R1 is connected to the wiring E3 positioned in a layer lower than the quenching resistor R1 via the contact hole provided in the insulating layer 17 (see FIG. 7). The wiring E3 is signal read wiring, is formed on the insulating layer 16, surrounds a circumference of the semiconductor region 14, and has a square ring shape.

Here, the quenching resistor R1 is positioned on the semiconductor region 14. Also, in a plan view (when an XY plane is viewed in a Z-axis direction), the signal read wiring E3 surrounds the circumference of the semiconductor region 14 in the ring shape and the quenching resistor R1 linearly extends without being bent.

Figure 6:
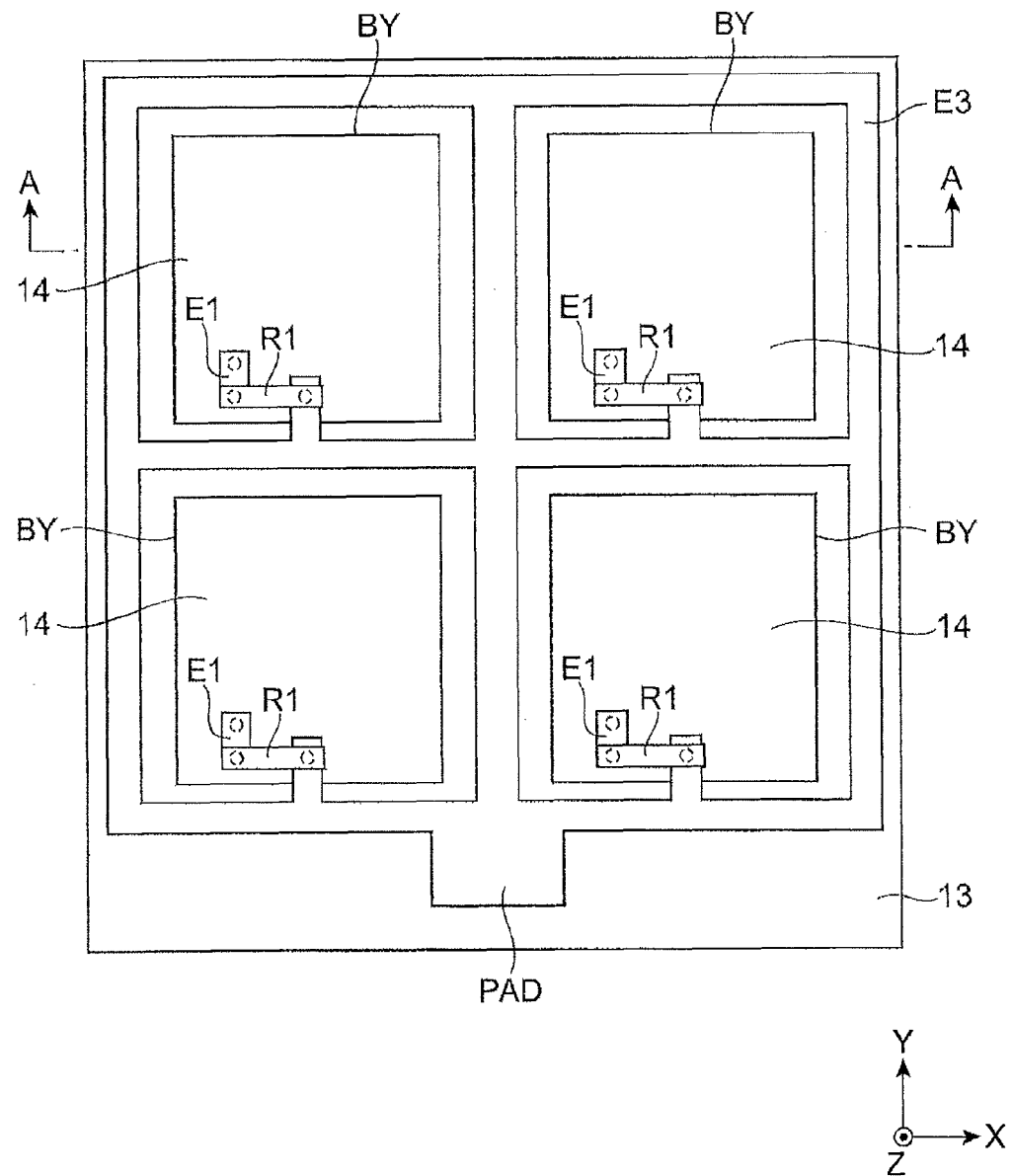
FIG. 6 is a plan view of a photodiode array including a plurality of unit structures as illustrated in FIG. 5.
Figure 7:
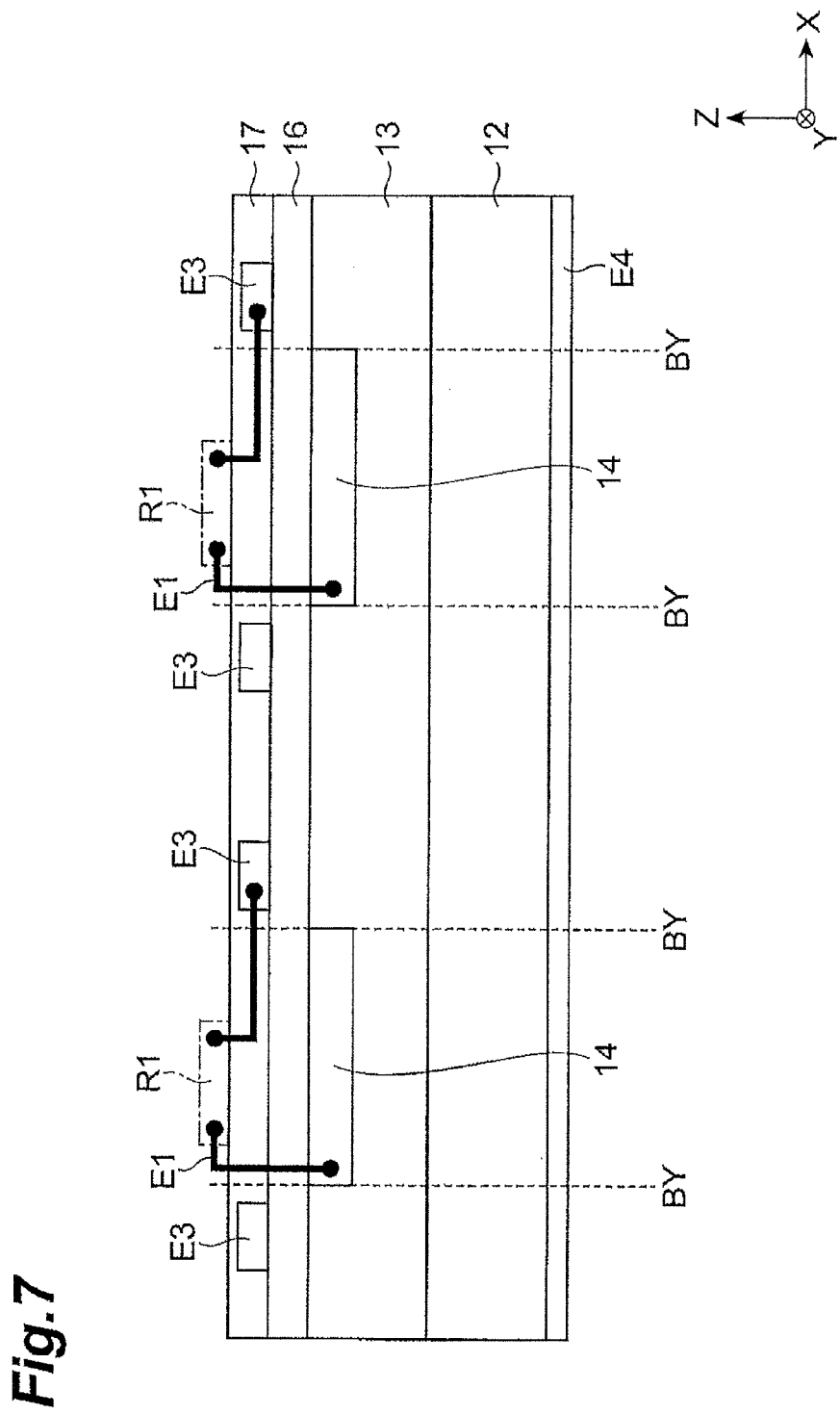
FIG. 7 is a view illustrating a vertical sectional configuration of a photodiode array of FIG. 6 or 11 taken along an arrowed line A-A.

FIG. 6 is a plan view of a photodiode array including a plurality of unit structures, and FIG. 7 is a view illustrating a vertical sectional configuration of the photodiode array of FIG. 6 taken along an arrowed line A-A.

All of the signal read wirings E3 are electrically connected to the electrode pad PAD. The electrode pad PAD is formed on the insulating layer 16. Although a photodiode array is formed in two rows and two columns in FIG. 6, the photodiode array may be formed in N rows×M columns (N and M are integers greater than or equal to 2). In a structure having a plurality of photodiodes, a plurality of semiconductor regions 14 are formed within one semiconductor region 13. Also, although the quenching resistor R1 is not actually viewed in the cross-sectional view of FIG. 7, the quenching resistor R1 is indicated by a chain line to clarify the description.

As described above, the quenching resistor R1 is positioned on the semiconductor region 14 via the insulating layers 16 and 17, and, in a plan view, the signal read wiring E3 surrounds the circumference of each semiconductor region 14 in the ring shape and each quenching resistor R1 linearly extends without being bent.

According to this optical detector, because the signal read wiring E3 surrounds the circumference of the semiconductor region 14 in the ring shape, a distance between the semiconductor region 14 and the signal read wiring E3 is significantly short and a capacitor is configured between the semiconductor region 14 and the signal read wiring E3. High frequency components (peak components) of a carrier generated in the semiconductor region 14 in response to the incidence of photons are quickly extracted to the outside via the capacitor. Here, the signal read wiring E3 can be formed in the above-described arrangement because the quenching resistor R1 is formed on the semiconductor region 14 and it is possible to increase a photon amount (sensitivity) to be detected per pixel because it is unnecessary to reduce an aperture ratio of the semiconductor region 14 due to an impediment by the wiring or the quenching resistor R1. Also, the quenching resistor R1 linearly extends without being bent, so that there is an advantage in that a part covering the semiconductor region 14 decreases and the aperture ratio increases.

As described above, an optical detector of the present embodiment includes a semiconductor substrate 12, a semiconductor region 13 (a first semiconductor region) formed on the semiconductor substrate 12, a plurality of semiconductor regions 14 (second semiconductor regions) formed two-dimensionally within the semiconductor region 13 and having a higher impurity concentration than the semiconductor region 13, a plurality of quenching resistors R1 electrically connected to the semiconductor regions 14, respectively, and signal read wiring E3 electrically connected to the plurality of quenching resistors R1.

Here, pn junctions can be formed in an interface between the semiconductor substrate 12 and the semiconductor region 13 or an interface between the semiconductor region 13 and the semiconductor region 14. These pn junctions constitute the APD which operates in the Geiger mode.

The semiconductor region 14 is a diffusion region formed when impurities are diffused within the semiconductor region 13 and has a higher impurity concentration than the semiconductor region 13. In this example (Type 1), the p-type semiconductor region 13 is formed on the n-type semiconductor substrate 12 (a semiconductor region) and the semiconductor region 14 to which p-type impurities are added at a high concentration is formed in the front surface side of the semiconductor region 13. Accordingly, the pn junction constituting the photodiode is formed between the semiconductor region 12 and the semiconductor region 13.

Also, a structure obtained by reversing the above-described conduction types can be adopted as a layer structure of the semiconductor substrate. That is, in a structure of (Type 2), the n-type semiconductor region 13 is formed on the p-type semiconductor region 12 and the semiconductor region 14 to which n-type impurities are added at a high concentration is formed in the front surface side of the semiconductor region 13.

Also, a pn junction interface can also be formed in a front surface layer side. In this case, in a structure of (Type 3), the n-type semiconductor region 13 is formed on the n-type semiconductor region 12 and the semiconductor region 14 to which p-type impurities are added at a high concentration is formed in the front surface side of the semiconductor region 13. Also, in the case of this structure, the pn junction is formed in the interface between the semiconductor region 13 and the semiconductor region 14.

Of course, the conduction types can be reversed even in this structure. That is, in a structure of (Type 4), the p-type semiconductor region 13 is formed on the p-type semiconductor region 12 and the semiconductor region 14 to which n-type impurities are added at a high concentration is formed in the front surface side of the semiconductor region 13.

Figure 8:
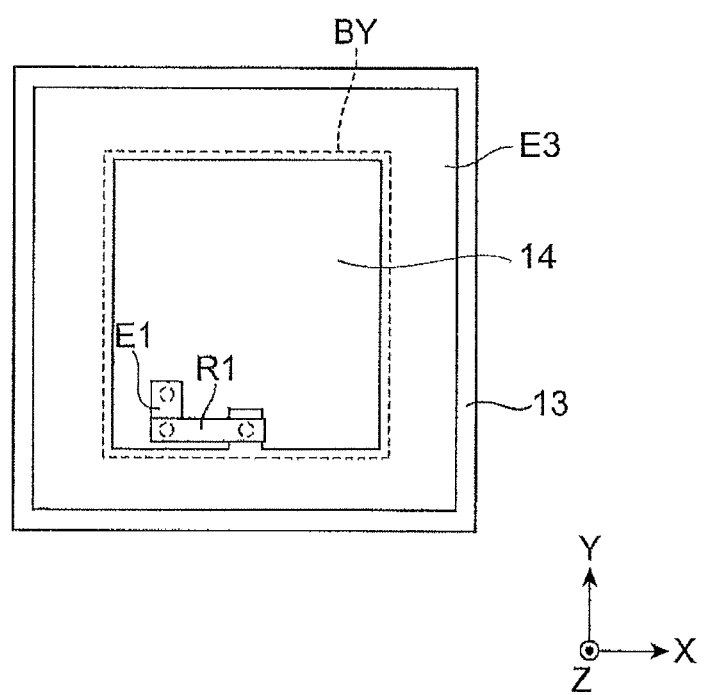
FIG. 8 is a plan view of an improved unit structure.

FIG. 8 is a plan view of an improved unit structure.

Figure 10:
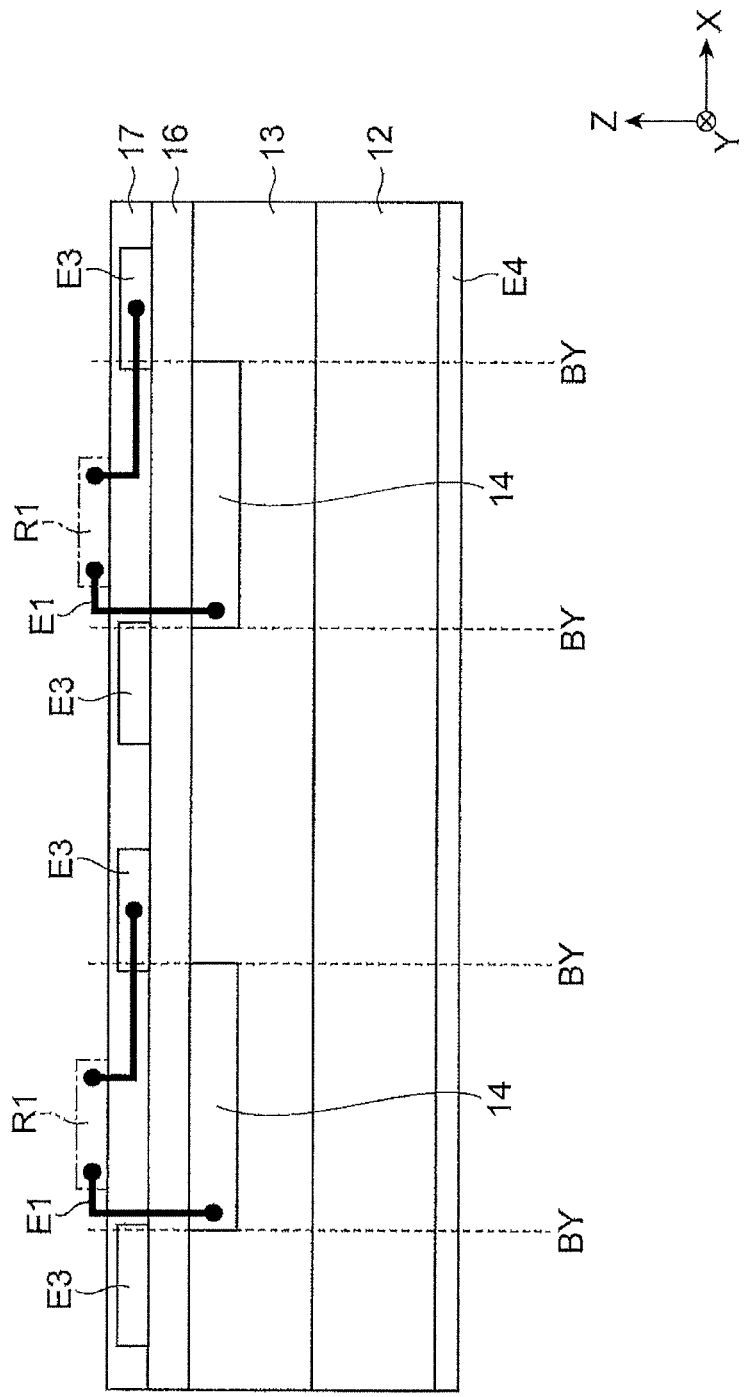
FIG. 10 is a view illustrating a vertical sectional configuration of the photodiode array of FIG. 9 taken along an arrowed line A-A.

The wiring E1 is connected to the quenching resistor R1 via the contact hole provided in the insulating layers 16 and 17 (see FIG. 10). The quenching resistor R1 is connected to the wiring E3 positioned in a layer lower than the quenching resistor R1 via the contact hole provided in the insulating layer 17 (see FIG. 10). The wiring E3 is signal read wiring, is formed on the insulating layer 16, surrounds the circumference of the semiconductor region 14, and has a square ring shape.

As in the above-described embodiment, the quenching resistor R1 is positioned on the semiconductor region 14. Also, in a plan view (when an XY plane is viewed in a Z-axis direction), the signal read wiring E3 surrounds the circumference of the semiconductor region 14 in the ring shape and the quenching resistor R1 linearly extends without being bent. Because of this, similar effects to the structures of FIGS. 5 and 7 are obtained.

This unit structure is different from that illustrated in FIG. 5 in terms of only a shape of the signal read wiring E3 and the remaining structure is the same as that illustrated in FIG. 5.

That is, in the plan view, a boundary line BY defining an edge of the semiconductor region 14 is covered with the signal read wiring E3. Also, in the case of the above-described structure illustrated in FIG. 5, the boundary line BY is not covered with the signal read wiring E3.

Figure 9:
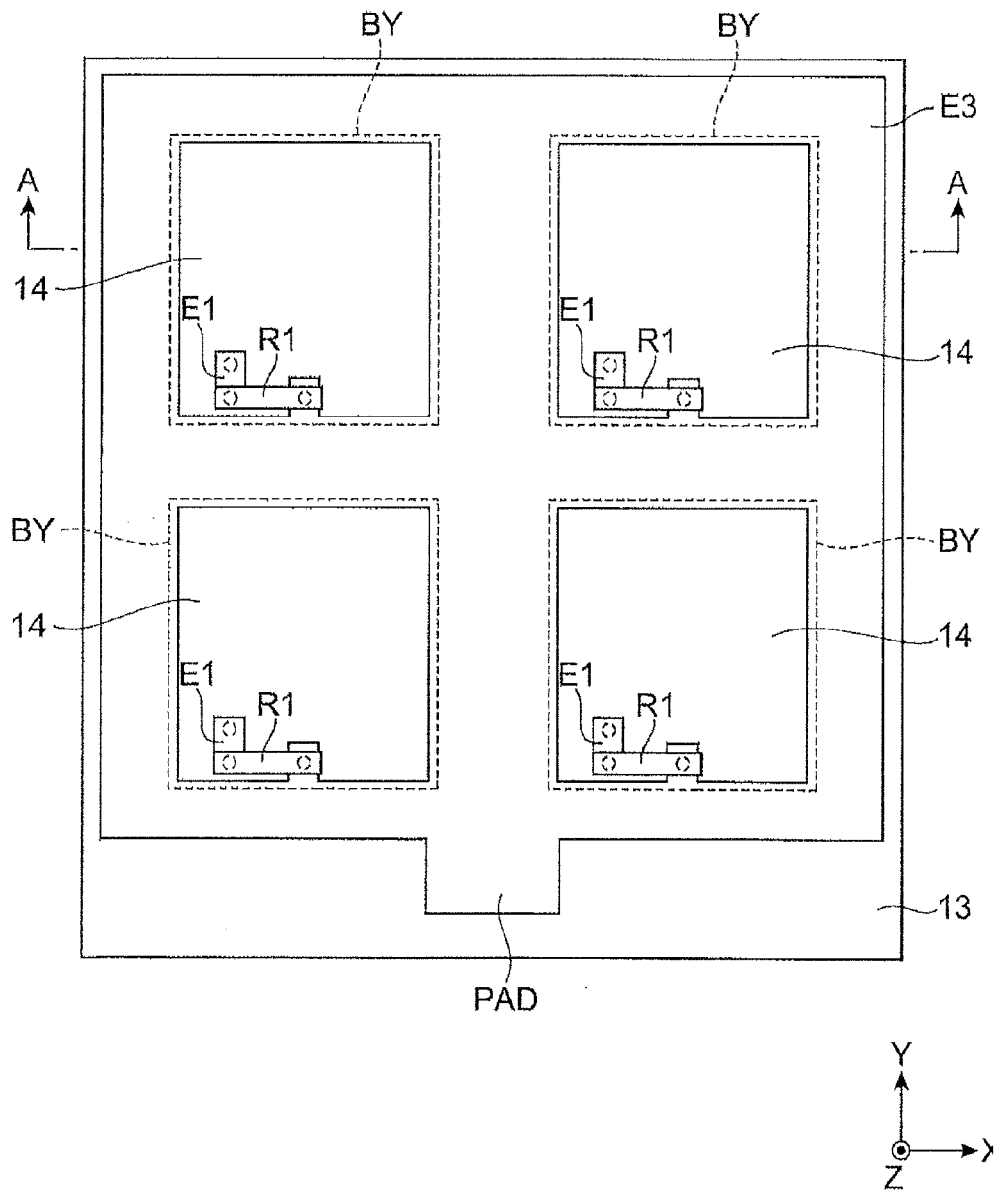
FIG. 9 is a plan view of a photodiode array including a plurality of unit structures as illustrated in FIG. 8.

FIG. 9 is a plan view of a photodiode array including a plurality of unit structures as illustrated in FIG. 8, and FIG. 10 is a view illustrating a vertical sectional configuration of the photodiode array of FIG. 9 taken along an arrowed line A-A.

This photodiode array is different from those illustrated in FIGS. 6 and 7 in terms of only a shape of the signal read wiring E3 and the remaining structure is the same as those illustrated in FIGS. 6 and 7.

That is, in the plan view, the signal read wiring E3 covers a boundary line BY (the edge of the semiconductor region 14) between the semiconductor region 14 and the first semiconductor region 13.

According to this optical detector, because the signal read wiring E3 surrounds the circumference of the semiconductor region 14 in the ring shape to cover the boundary line BY, a distance between the semiconductor region 14 and the signal read wiring E3 is significantly short and a capacitor is configured between the semiconductor region 14 and the signal read wiring E3. High frequency components (peak components) of a carrier generated in the semiconductor region 14 in response to the incidence of a photon are quickly extracted to the outside via the capacitor.

Also, the signal read wiring E3 covers the above-described boundary line BY so that the potential in the vicinity of the boundary in the semiconductor is stabilized and the output signal is stabilized. Here, the signal read wiring E3 can be formed in the above-described arrangement because the quenching resistor R1 is formed on the semiconductor region 14 and it is possible to increase a photon amount (sensitivity) to be detected per pixel because it is unnecessary to reduce the aperture ratio of the semiconductor region 14 due to an impediment by the wiring or the quenching resistor.

As described above, according to the optical detector of the above-described structure, it is possible to simultaneously increase a peak of an output signal and sensitivity and further obtain stability.

Also, in the optical detector, the signal read wiring E3 covers the entire boundary line BY between the semiconductor region 14 and the semiconductor region 13 in the plan view. In this case, it is possible to increase the peak of the output signal via the signal read wiring by increasing the capacitance of a capacitor formed between the signal read wiring E3 and the semiconductor region 14.

Figure 11:
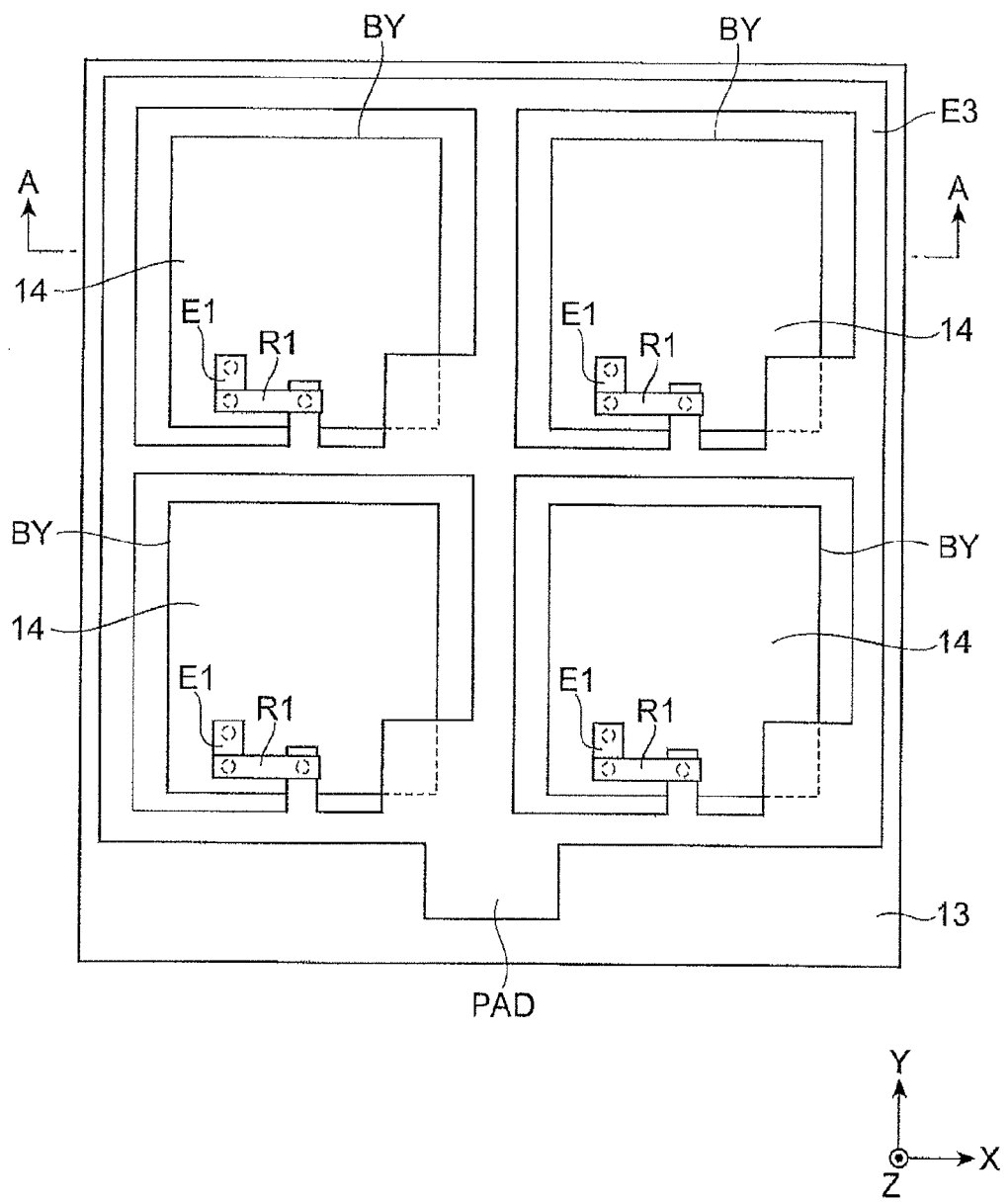
FIG. 11 is a plan view of another improved photodiode array.

FIG. 11 is a plan view of another improved photodiode array. Also, a cross-sectional structure taken along an arrow line A-A of FIG. 11 is the same as that of FIG. 7.

The structure of this photodiode array is different from the structures of FIGS. 6 and 7 in terms of only the shape of the signal read wiring E3 and the remaining structure is the same as those of FIGS. 6 and 7.

In this optical detector, in the plan view, the signal read wiring E3 covers only a part of the boundary line BY between the semiconductor region 14 and the semiconductor region 13 (only right and left corner portions of the drawing). A size of a width direction of the signal read wiring E3 of the part covering the boundary line BY in the signal read wiring E3 (a size of a Y-axis direction for the wiring extending along an X-axis or a size of an X-axis direction for the wiring extending along a Y-axis) is greater than a size of the width direction of a part adjacent to the part.

In this case, the signal read wiring E3 covers only a part of the above-described boundary line BY, but it is possible to increase the peak of the output signal via the signal read wiring by increasing the capacitance of the capacitor because the size of the width direction is large.

FIG. 12 is a graph illustrating time t (ns) and intensity I (a. u.) of an output signal of a photodiode array, wherein (A) illustrates data of a comparative example and (B) illustrates data of an embodiment (the structure of FIG. 9).

One hash-mark of the horizontal axis indicates 5 (ns) and time t0 of an initial value of the graph indicates a time of −5 (ns). Also, a pixel size (a length of one side of one ring-shaped square constituted of the signal read wiring E3) is 50 (μm).

In the comparative example, in the structure of FIG. 6, the position of the quenching resistor is arranged outside the ring-shaped signal read wiring E3 and the ring-shaped signal read wirings E3 are connected by a separate signal read wiring to read a signal.

In the case of the structure of the embodiment, as described above, it can be seen that the signal read operation via the capacitor is easily performed because the second semiconductor region and the signal read wiring are adjacent and the height of the peak of the signal intensity I is higher than that of the comparative example. That is, a waveform peak of a detection signal output from the optical detector in an initial step is higher than that of the comparative example when fluorescence emitted from the scintillator is incident on the optical detector. Also, when the incident amount increases, the height of the peak increases.

As described above, the above-described optical detector is an optical detector which includes a semiconductor substrate 12, a first semiconductor region 13 formed on the semiconductor substrate 12, a plurality of second semiconductor regions 14 formed two-dimensionally within the first semiconductor region 13 and having a higher impurity concentration than the first semiconductor region 13, a plurality of quenching resistors R1 electrically connected to the second semiconductor regions 14, respectively, and signal read wiring B3 electrically connected to the plurality of quenching resistors R1 and which has a pn junction constituting an APD operable in a Geiger mode formed in an interface between the semiconductor substrate 12 and the first semiconductor region 13 or an interface between the first semiconductor region 13 and the second semiconductor region 14, wherein the quenching resistor R1 is positioned on the second semiconductor region 14, and wherein, in a plan view, the signal read wiring E3 surrounds the circumference of each second semiconductor region 14 in a ring shape and increases an output signal intensity peak.

Finally, materials of the elements will be described.

The quenching resistor R1 has a resistivity higher than that of the signal read wiring E3 connected thereto. The quenching resistor R1 is made of, for example, polysilicon. As a method of forming the quenching resistor R1, chemical vapor deposition (CVD) can be used. Other examples of resistive elements constituting the quenching resistor R1 include SiCr, NiCr, TaNi, and FeCr.

The above-described electrodes are made of a metal such as aluminum. When the semiconductor substrate is made of Si, AuGe/Ni, etc. as well as Al are often used as an electrode material. Also, a through-electrode and a bump can be used as a signal extraction structure.

When Si is used, a group 3 element such as B is used as p-type impurities, while a group 5 element such as N, P, or As is used as n-type impurities. Even when an element is configured by replacing the n and p types, which are conduction types of the semiconductor, with each other, it is possible to enable the relevant element to function. As a method of adding these impurities, diffusion or ion implantation may be used.

$SiO_2$ or $SiN_x$ may be used as a material for the above-mentioned insulating layers and a thermal oxidation method or a sputtering method may be used as a method of forming the insulating layers when each of the insulating layers is made of $SiO_2$.

Preferred ranges of the conduction type, impurity concentration, and thickness of each layer in the above-described semiconductor structure are as follows:

(Type 1)
Semiconductor region 12 (conduction type/impurity concentration/thickness): n-type/$5\times10^{11}$ to $1\times10^{20}$ cm$^{-3}$/30 to 700 μm
Semiconductor region 13 (conduction type/impurity concentration/thickness): p-type/$1\times10^{14}$ to $1\times10^{17}$ cm$^{-3}$/2 to 50 μm
Semiconductor region 14 (conduction type/impurity concentration/thickness): p-type/$1\times10^{18}$ to $1\times10^{20}$ cm$^{-3}$/10 to 1000 nm
(Type 2)
Semiconductor region 12 (conduction type/impurity concentration/thickness): p-type/$5\times10^{11}$ to $1\times10^{20}$ cm$^{-3}$/30 to 700 μm
Semiconductor region 13 (conduction type/impurity concentration/thickness): n-type/$1\times10^{14}$ to $1\times10^{17}$ cm$^{-3}$/2 to 50 μm
Semiconductor region 14 (conduction type/impurity concentration/thickness): n-type/$1\times10^{18}$ to $1\times10^{17}$ cm$^{-3}$/10 to 1000 nm
(Type 3)
Semiconductor region 12 (conduction type/impurity concentration/thickness): n-type/$5\times10^{11}$ to $1\times10^{20}$ cm$^{-3}$/30 to 700 μm
Semiconductor region 13 (conduction type/impurity concentration/thickness): n-type/$1\times10^{14}$ to $1\times10^{17}$ cm$^{-3}$/2 to 50 μm
Semiconductor region 14 (conduction type/impurity concentration/thickness): p-type/$1\times10^{18}$ to $1\times10^{20}$ cm$^{-3}$/10 to 1000 nm
(Type 4)
Semiconductor region 12 (conduction type/impurity concentration/thickness): p-type/$5\times10^{11}$ to $1\times10^{20}$ cm$^{-3}$/30 to 700 μm
Semiconductor region 13 (conduction type/impurity concentration/thickness): p-type/$1\times10^{14}$ to $1\times10^{17}$ cm$^{-3}$/2 to 50 μm
Semiconductor region 14 (conduction type/impurity concentration/thickness): n-type/$1\times10^{18}$ to $1\times10^{20}$ cm$^{-3}$/10 to 1000 nm Also, although the signal read wiring covers the entire boundary line constituting the edge of the second semiconductor region in the above-described embodiment, a similar effect to the above is basically obtained even when there are some uncovered positions. In this case, a length of the boundary line covered with the signal read wiring is longer than a length of the boundary line uncovered with the signal read wiring in the circumference of the second semiconductor region, and the signal read wiring is configured to cover the boundary line in a plurality of sides constituting the edge of the second semiconductor region.

As described above, according to the optical detector of the above-described structure, it is possible to simultaneously increase a peak of an output signal and sensitivity and further obtain stability. Also, a detector having such an optical detector can be applied to a subject diagnostic device such as a PET device or a CT device and can form a highly precise image from its output signal.

REFERENCE SIGNS LIST

SC Scintillator
R1 Quenching resistor
D1 Optical detector
12 Semiconductor substrate
13 First semiconductor region
14 Second semiconductor region (light detection channel)

The invention claimed is:
1. An optical detector comprising:
a semiconductor substrate;
a first semiconductor region formed on the semiconductor substrate;
second semiconductor regions formed two-dimensionally within the first semiconductor region and having a higher impurity concentration than the first semiconductor region;
quenching resistors electrically connected to the second semiconductor regions, each of the quenching resistors being connected to one respective second semiconductor region from among the second semiconductor regions; and
ring-shaped signal read wiring portions electrically connected to the quenching resistors, each of the ring-shaped signal read wiring portions being connected to one respective quenching resistor from among the quenching resistors;
wherein the optical detector comprises a pn junction that forms an avalanche photodiode operable in a Geiger mode formed in an interface between the semiconductor substrate and the first semiconductor region or between the first semiconductor region and the one respective second semiconductor region,
wherein each of the quenching resistors is positioned above the one respective second semiconductor region, and
wherein, in a plan view, each of the ring-shaped signal read wiring portions surrounds circumferences of the one respective second semiconductor region, and covers boundary lines between the one respective second semiconductor region and the first semiconductor region, and
wherein each of the quenching resistors is positioned inside the one respective ring-shaped signal read wiring portion.
2. The optical detector according to claim 1, wherein, in the plan view, the signal read wiring covers the entire boundary line between the one respective second semiconductor region and the first semiconductor region.
3. The optical detector according to claim 1,
wherein, in the plan view, each of the ring-shaped signal read wiring portions comprises:
a first portion covering a part of the boundary line between the one respective second semiconductor region and the first semiconductor region, and
a second portion adjacent to the first portion,
wherein a size of a width direction of the first portion is greater than a size of a width direction of the second portion.
4. An optical detector comprising:
a semiconductor substrate;
a first semiconductor region formed on the semiconductor substrate;
second semiconductor regions formed two-dimensionally within the first semiconductor region and having a higher impurity concentration than the first semiconductor region;
quenching resistors electrically connected to the second semiconductor regions, each of the quenching resistors being connected to one respective second semiconductor region from among the second semiconductor regions; and
ring-shaped signal read wiring portions electrically connected to the quenching resistors, each of the ring- shaped signal read wiring portions being connected to one respective quenching resistor from among the quenching resistors; and wherein the optical detector comprises a pn junction that forms an avalanche photodiode operable in a Geiger mode formed in an interface between the semiconductor substrate and the first semiconductor region or between the first semiconductor region and the one respective second semiconductor region, wherein each of the quenching resistors is positioned above the one respective second semiconductor region, wherein, in a plan view, each of the ring-shaped signal read wiring portions surrounds circumferences of the one respective second semiconductor region, wherein each of the quenching resistors is positioned inside the one respective ring-shaped signal read wiring portion, and wherein each quenching resistor linearly extends without being bent.

5. An optical detector comprising:
a semiconductor substrate;
a first semiconductor region formed on the semiconductor substrate;
second semiconductor regions formed two-dimensionally within the first semiconductor region and having a higher impurity concentration than the first semiconductor region;

quenching resistors electrically connected to the second semiconductor regions, each of the quenching resistors being connected to one respective second semiconductor region from among the second semiconductor regions; and ring-shaped signal read wiring portions electrically connected to the quenching resistors, each of the ring-shaped signal read wiring portions being connected to one respective quenching resistor from among the quenching resistors;

wherein the optical detector comprises a pn junction that forms an avalanche photodiode operable in a Geiger mode formed in an interface between the semiconductor substrate and the first semiconductor region or between the first semiconductor region and the one respective second semiconductor region, wherein each of the quenching resistors is positioned above the one respective second semiconductor region, and wherein, in a plan view, each of the ring-shaped signal read wiring portions surrounds circumferences of the one respective second semiconductor region, and wherein each of the quenching resistors is positioned inside the one respective ring-shaped signal read wiring portion.

* * * * *